(12) United States Patent
Ueno et al.

(10) Patent No.: US 7,684,202 B2
(45) Date of Patent: Mar. 23, 2010

(54) STRUCTURE FOR MOUNTING MULTIFUNCTIONAL VIBRATING ACTUATOR ON CIRCUIT BOARD

(75) Inventors: Kenji Ueno, Tokyo (JP); Minoru Ueda, Tokyo (JP)

(73) Assignee: Namiki Seimitsu Houseki Kabushiki Kaisha (JP)

( * ) Notice: Subject to any disclaimer, the term of this patent is extended or adjusted under 35 U.S.C. 154(b) by 716 days.

(21) Appl. No.: 10/562,266

(22) PCT Filed: Jun. 8, 2004

(86) PCT No.: PCT/JP2004/007952

§ 371 (c)(1), (2), (4) Date: Jun. 6, 2006

(87) PCT Pub. No.: WO2005/000485

PCT Pub. Date: Jan. 6, 2005

(65) Prior Publication Data

US 2007/0140509 A1 Jun. 21, 2007

(30) Foreign Application Priority Data

Jun. 30, 2003 (JP) .............................. 2003-188011

(51) Int. Cl.
*H05K 5/00* (2006.01)
(52) U.S. Cl. ...................... 361/752; 174/260
(58) Field of Classification Search .............. 361/752; 174/260; 381/396, 409
See application file for complete search history.

(56) References Cited

U.S. PATENT DOCUMENTS

| 5,903,076 | A  | * | 5/1999  | Suyama ...................... 310/81 |
| 6,229,249 | B1 | * | 5/2001  | Hatanaka et al. ............. 310/348 |
| 6,274,955 | B1 | * | 8/2001  | Satoh et al. ................... 310/71 |
| 6,590,991 | B1 | * | 7/2003  | Maeda ........................ 381/409 |
| 6,807,282 | B2 | * | 10/2004 | Kaneda et al. .............. 381/396 |
| 7,260,230 | B2 | * | 8/2007  | Feng ........................... 381/174 |
| 2004/0217673 | A1 | * | 11/2004 | Unno et al. .................. 310/348 |

FOREIGN PATENT DOCUMENTS

| JP | 2000-023440 | 1/2000 |
| JP | 2003-088806 | 3/2003 |
| JP | 2003-154315 | 5/2003 |

* cited by examiner

*Primary Examiner*—Jinhee J Lee
*Assistant Examiner*—Yuriy Semenenko
(74) *Attorney, Agent, or Firm*—Studebaker & Brackett PC; Donald R. Studebaker

(57) ABSTRACT

To enable the mounting of a multifunctional vibrating actuator on the surface of a circuit board by solder reflow without exposing the components with poor heat resistance the diaphragm, magnet, and voice coil—to the high temperatures of the reflow tank, the structure for mounting a multifunctional vibrating actuator on a circuit board is constituted such that a bracket is fixed to the surface of the circuit board by solder reflow, and then the housing of the multifunctional vibrating actuator is placed in the bracket so that the terminals of the multifunctional vibrating actuator are electrically connected to the electrodes of the circuit board.

9 Claims, 14 Drawing Sheets

PRIOR ART

PRIOR ART

PRIOR ART

STRUCTURE FOR MOUNTING MULTIFUNCTIONAL VIBRATING ACTUATOR ON CIRCUIT BOARD

BACKGROUND OF THE INVENTION

1. Field Technology of the Invention

The present invention relates to a structure for mounting on a circuit board a multifunctional vibrating actuator to be installed in a portable terminal equipment such as portable telephones.

2. Description of Related Art

Devices for notification of incoming calls is mounted in portable terminal equipment such as portable telephones; among these devices are multifunctional vibrating actuators that have been devised and implemented to inform users of incoming calls by means of an audible melody or buzzer or a bodily sensible vibration, and also function as a receiver speaker.

FIG. 20 shows a typical structure of a multifunctional vibrating actuator as described above (see, for example, Patent Document 1).

Patent Document 1: Japanese Patent No. 3363792 (pages 3 to 6, FIG. 1)

As shown in FIG. 20, the multifunctional vibrating actuator 100 has a flat casing with a cylindrical housing 2 that is open at both ends, with a plate-shaped cover 101 attached to the upper opening of the housing 2 and a plate-shaped bracket 3 attached to the lower opening of the housing 2. Within this casing there is provided a diaphragm 4 that produces sound waves by being vibrated at a resonant frequency in the audible range (such as 2.5 kHz) and a magnetic circuit 5 that vibrates the casing by being vibrated at a resonant frequency lower than the resonant frequency of the diaphragm 4 (such as 130 Hz). Further, there is provided a terminal seat 9 on the housing 2 to which are attached a pair of terminals 102, 103 for input to the voice coil 12 of a driver signal that drives the diaphragm 4 and/or the magnetic circuit 5.

The pair of terminals 102, 103 has left/right symmetry and the two have basically the same structure; therefore only the terminal 102 is explained here. As shown in FIG. 21, the terminal 102 comprises a strip-shaped terminal body 102a and a contact 102b that is formed by bending the strip at a right angle at the lower end of the terminal body 102a. A connector 102c is formed as a notch at the upper end of the terminal body 102a. Further, two wedges 102d, 102e with a height of about 0.1 mm project from the edges of the terminal body 102a. By this means, when the terminals 102, 103 are inserted into the terminal seat 9, the wedging action of the wedges 102d, 103e holds them firmly in the terminal seat 9.

The magnetic circuit 5 comprises a suspension 13 formed so that it can deform flexibly in the up and down direction of FIG. 20, a magnet 6, and a pole piece 7 and a yoke 8 that sandwich the magnet 6. The magnetic circuit 5 is fastened to the inner periphery of the suspension 13, and the outer periphery of the suspension 13 is attached by means of sandwiching between the housing 2 and the bracket 3. In this way, the magnetic circuit 5 is able to vibrate up and down relative to the housing 2.

The diaphragm 4, on the other hand, has a voice coil 12 attached to it, and its outer periphery is sandwiched between the housing 2 and the cover 101. A portion of the voice coil 12 is drawn outside the housing 2 and attached to the connectors 102c, 103c of the terminals 102, 103 as shown in FIG. 22, thus electrically connecting the terminals 102, 103 and the voice coil 12. In this way, the diaphragm 4 is able to vibrate up and down relative to the housing 2. The voice coil 12 is located within the electrical gap G of the magnetic circuit 5. By this means, when a driver signal is impressed on the voice coil 12, a magnetic attraction or repulsion operates between the magnetic circuit 5 and the diaphragm 4. Accordingly, by changing the frequency of the driver signal impressed on the voice coil 12, it is possible to drive vibration of the magnetic circuit 5 and/or the diaphragm 4.

In order to make the electrical connection between the terminals mentioned above and the circuit board that is installed in the portable terminal equipment, this sort of multifunctional vibrating actuator has been both mounted on the surface of the circuit board and held in place by the case of the portable terminal equipment.

In recent years, the multifunctional vibrating actuator has had to be fixed to the surface of the circuit board by means of solder reflow. That is because the components other than the multifunctional vibrating actuator—the ICs and LSIs—are mounted on the surface of the circuit board by means of solder reflow, and work efficiency is improved if the multifunctional vibrating actuator is compatible with solder reflow fixing and can be mounted to the circuit board in the same process as the other components.

The mounting of the multifunctional vibrating actuator 100 to the surface of the circuit board by means of solder reflow fixing is explained next with reference to FIGS. 23 through 25. As shown in FIG. 23, a land 104b for solder reflow fixing of the bracket 3 is formed in advance on the surface of the circuit board 14, and electrodes 104a, 105a are formed there for the solder reflow fixing of the contacts 102b, 103b of the terminals 102, 103. Then, at the time of solder reflow mounting and fixing, a cream solder (not illustrated) is applied to the land 104b and the electrodes 104a, 105a.

Next, as shown in FIGS. 24 and 25, the multifunctional vibrating actuator 100 is positioned on the surface of the circuit board 14. It is aligned to position the bracket 3 on the land 104b and the contacts 102b, 103b, on the electrodes 104a, 105a. Then the circuit board 14 with the multifunctional vibrating actuator 100 is inserted in a reflow tank and heated to melt the solder. After heating, the circuit board 14 is removed from the reflow tank, the solder solidifies, and the multifunctional vibrating actuator 100 is fixed to the surface of the circuit board 14.

BRIEF SUMMARY OF THE INVENTION

In the conventional constitution, the multifunctional vibrating actuator 100 is positioned on the circuit board 14, and then the multifunctional vibrating actuator 100, together with the circuit board 14, is placed in the reflow tank where the solder melts and solidifies. Accordingly, the components that make up the multifunctional vibrating actuator 100 are unavoidable exposed to the high temperatures of the reflow tank. Because the diaphragm 4 is made of an industrial plastic such as PET, there is a problem of deformation due to the high temperature, which has an adverse effect on the acoustic characteristics.

Moreover, a rare earth magnet is frequently used as the magnet in the magnetic circuit of the multifunctional vibrating actuator, and there is the problem of a loss of magnetism because of the high temperature of the reflow tank and deterioration of magnetic characteristics.

Further, in the conventional constitution, a portion of the voice coil 12 is directly connected electrically to the terminals 102, 103, and so the heat of the reflow tank is conducted through the electrodes 104a, 105a and the terminals 102, 103 to the voice coil 12, which sometimes gives rise to abnormal short circuits due to breakdown of the insulation layer of the lead wires that form the voice coil.

An object of the present invention is to solve the problems described above by making it possible to mount and fix the multifunctional vibrating actuator to the surface of the circuit board by solder reflow; the multifunctional vibrating actuator is mounted and fixed on the surface of the circuit board by first mounting and fixing the bracket to the surface of the circuit board by solder reflow, and then attaching the multifunctional vibrating actuator to the bracket.

Because the solder melts during the solder reflow, there is the further problem that the surface tension of the molten solder causes the mounted components to float up, and the precision of component positioning relative to the surface of the circuit board is reduced. The present invention has another object of solving the problems that occur during the actual mounting and fixing of the multifunctional vibrating actuator on the surface of the circuit board by solder reflow, and thus providing a solder reflow method of mounting on the circuit board that allows high precision in the positioning of the multifunctional vibrating actuator relative to the surface of the circuit board.

The invention described in claim 1 of the present invention provides a structure for mounting a multifunctional vibrating actuator on a circuit board, the multifunctional vibrating actuator having a diaphragm, a magnetic circuit that is positioned facing the diaphragm and that forms a magnetic path, a suspension that supports the magnetic circuit, a housing that supports the diaphragm and the suspension, and a means of driving that produces magnetic drive that operates between the diaphragm and the magnetic circuit, and having terminals that are attached to the housing and that are electrically connected to the means of driving, wherein a bracket is fixed to a surface of the circuit board by means of solder reflow, and the housing is held in place by the bracket, whereby the multifunctional vibrating actuator is mounted on the surface of the circuit board with the terminals electrically connected to the circuit board.

The invention described in claim 2 of the present invention provides a structure for mounting a multifunctional vibrating actuator on a circuit board, wherein a mounting position of the multifunctional vibrating actuator relative to the circuit board is set on a surface near one end of the circuit board, there is provided a projection on a surface of the bracket that faces the circuit board, and the bracket is fixed by solder reflow to the surface of the circuit board while the bracket is held in place on the surface of the circuit board by said projection.

The invention described in claim 3 of the present invention provides a structure for mounting a multifunctional vibrating actuator on a circuit board, wherein the surface of the bracket that faces the circuit board has two or more convex contacts that contact solder applied to the surface of the of the circuit board and are fixed by solder reflow.

The invention described in claim 4 of the present invention provides a structure for mounting a multifunctional vibrating actuator on a circuit board, wherein the multiple contacts are set at an edge of the bracket.

The invention described in claim 5 of the present invention provides a structure for mounting a multifunctional vibrating actuator on a circuit board, wherein flat electrodes formed on the surface of the circuit board are formed with different ratios of length measurement to width measurement, and a positive electrode and a negative electrode have positions that are the same in a length direction.

The invention described in claim 6 of the present invention provides a structure for mounting a multifunctional vibrating actuator on a circuit board, wherein flat electrodes formed on the surface of the circuit board are formed with different ratios of length measurement to width measurement, and a positive electrode and a negative electrode have positions that differ in a length direction.

The invention described in claim 7 of the present invention provides a structure for mounting a multifunctional vibrating actuator on a circuit board, wherein the bracket is formed in a dish shape, with a bottom part and a rim that rises from an edge of the bottom part, an end of the housing of the multifunctional vibrating actuator is fitted to the rim to attach the bracket to the housing, there are provided a tab on the end of the housing that fits with the rim and multiple cut-outs in the rim that fit with the tab, and the cut-outs is formed as a unit by cutting lower than the height of the cut-outs.

The invention described in claim 8 of the present invention provides a structure for mounting a multifunctional vibrating actuator on a circuit board, wherein a flat surface of the bracket is formed with an unequal length/width ratio, and there are provided on a surface of the bracket rim on a longer axis of the length/width ratio two or more convex contacts that contact the solder applied to the surface of the circuit board and that are fixed by solder reflow.

The invention described in claim 9 of the present invention provides a portable terminal equipment in which a multifunctional vibrating actuator is mounted using any one of the structure for mounting a multifunctional vibrating actuator on a circuit board of claims 1 through 8.

As explained above, by using the invention described in claim 1 of the present invention, the bracket is first fixed to the surface of the circuit board by solder reflow. After the heat has radiated from the circuit board and the bracket, the multifunctional vibrating actuator that is completely assembled except for the bracket is fitted and fixed in place to mount it on the bracket. In this way, the multifunctional vibrating actuator can be mounted on the circuit board with the components of the multifunctional vibrating actuator that have little resistance to the high temperatures that accompany heating in the reflow tank during solder reflow fixing (the voice coil, diaphragm, and magnet) not being exposed to the high temperatures of the reflow tank.

Moreover, by using the invention described in claim 2 of the present invention, a projection is formed as a part of the bottom surface of the bracket that contacts the circuit board, and so it is possible to fix the bracket to the surface of the circuit board by solder reflow with the projection held in place at the end of the circuit board. Accordingly, in addition to the effect of claim 1, even if surface tension is produced between the bottom of the bracket and the surface of the circuit board when the solder melts, the projection is held in place at the end of the circuit board and the bracket is prevented from floating up from the surface of the circuit board. Therefore, it is possible to fix the bracket to the surface of the circuit board by solder reflow fixing while assuring accurate positioning of the bracket on the surface of the circuit board.

Because the bracket is fixed by solder reflow with accurate positioning assured, the multifunctional vibrating actuator that is fitted and fixed to the bracket can be mounted on the surface of the circuit board with accurate positioning.

Moreover, by using the invention described in claim 3 of the present invention, there are provided on the surface of the bracket that faces the circuit board two or more convex contacts that contact the solder applied to the circuit board and are fixed by solder reflow. Therefore, in addition to the effects described above, it is possible to limit the portion affected by surface tension to the small number of contacts. Accordingly, the bracket can be fixed in place with accurate positioning on the circuit board using an accurate self-alignment effect.

Moreover, in addition to the effects described above, by using the invention described in claim 4 of the present invention the multiple contacts are located on the edge of the bracket, and so the space between the contact portions affected by surface tension is as large as possible, enabling an accurate self-alignment effect.

Moreover, by the using the inventions described in claims 5 or 6, the flat electrodes formed on the surface of the circuit board are formed with different ratios of length measurement to width measurement, and the positive electrode and the negative electrode have positions that are the same in the length direction; this makes it possible to have a certain degree of width in the width measurement of the electrodes. In addition to the effects described above, therefore, even if the overall position of the multifunctional vibrating actuator is not correct because the bracket is floated up by the molten solder during solder reflow and the contact position of the terminals is outside the defined position, it is possible to make up for that when the actuator is fitted and fixed to the bracket by means of the expanded dimensions of the electrodes in the width direction. Accordingly, electrical contact between the multifunctional vibrating actuator and the circuit board can be assured by always securing contact between the terminal contact points and the electrodes.

Therefore, this is very suitable as a structure for solder reflow fixing of the multifunctional vibrating actuator.

Moreover, by using the invention described in claim 7, there are provided multiple cut-outs in the rim of the bracket that fit with the tab on the end of the housing, the cut-outs being formed as a unit by cutting lower than the height of the cut-outs. In addition to the effects described above, even if the position of the cut-outs relative to the surface of the circuit board changes because the bracket is floated by the self-alignment effect, there are provided multiple cut-outs at a distance that corresponds to the amount that the bracket floats, and so one of the multiple cut-outs will always be located at a given position relative to the circuit board. Consequently, it is possible to fit and fix the multifunctional vibrating actuator to the bracket while having it always in a given position relative to the surface of the circuit board, and so electrical contact between the multifunctional vibrating actuator and the circuit board can always be assured by securing contact between the contact points of the terminals and the electrodes.

Moreover, by using the invention described in claim 8, the flat surface of the bracket is formed with a different length/width ratio and there are provided at least two convex contacts at the edge of the bracket on the long axis of the length/width ratio, which contact the solder applied to the surface of the circuit board and are fixed to it by solder reflow, and so it is possible to increase the space between the contacts. Accordingly, in addition to the effects described above, it is possible to achieve a more accurate self-alignment effect, and so the bracket can be fixed to the surface of the circuit board by solder reflow with more accurate positioning relative to the circuit board. Therefore, it is possible to further improve the precision of the positioning, relative to the circuit board, of the multifunctional vibrating actuator that is fitted and fixed to the bracket.

Moreover, by using the invention described in claim 9, it is possible to mount the multifunctional vibrating actuator in portable terminal equipment by means of the effects of the inventions described in claims 1 through 8.

DETAILED DESCRIPTION OF THE INVENTION

First Embodiment

Figure 1:
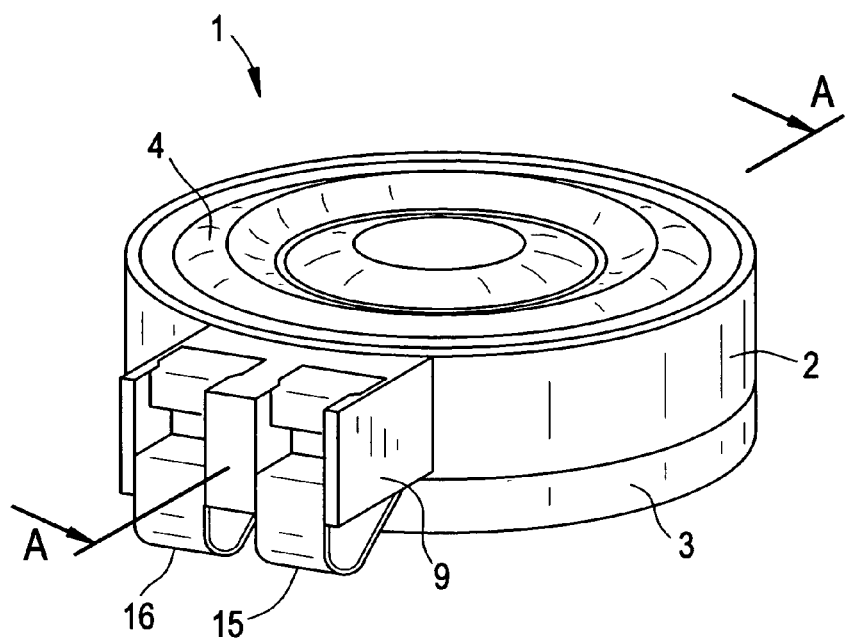
FIG. 1—A perspective view showing an external view of the multifunctional vibrating actuator involved in the structure for mounting on a circuit board of the first embodiment.
Figure 2:
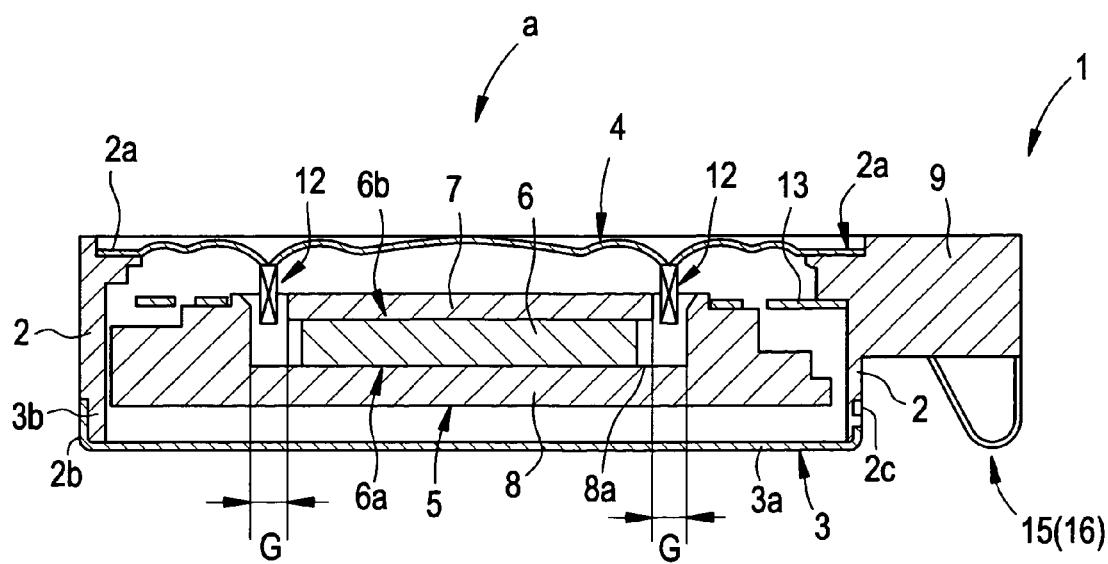
FIG. 2—A side cross sectional view showing an internal structure of the multifunctional vibrating actuator, taken along broken line A-A of FIG. 1.
Figure 3:
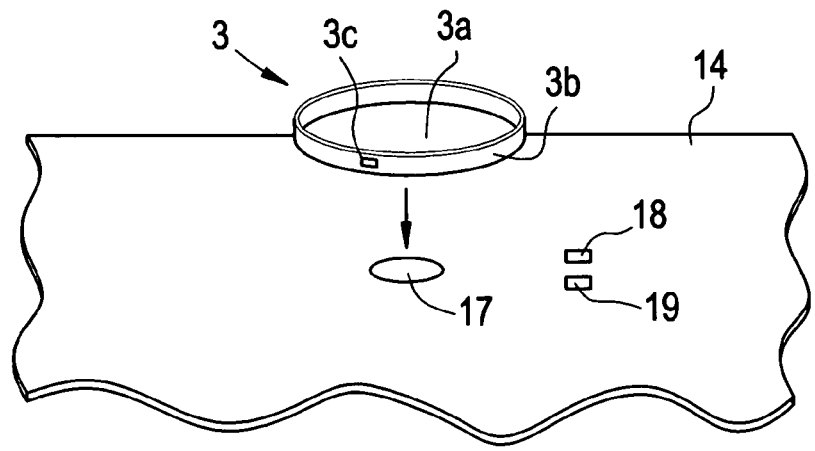
FIG. 3—A perspective view showing a bracket that is a part of the multifunctional vibrating actuator.
Figure 4:
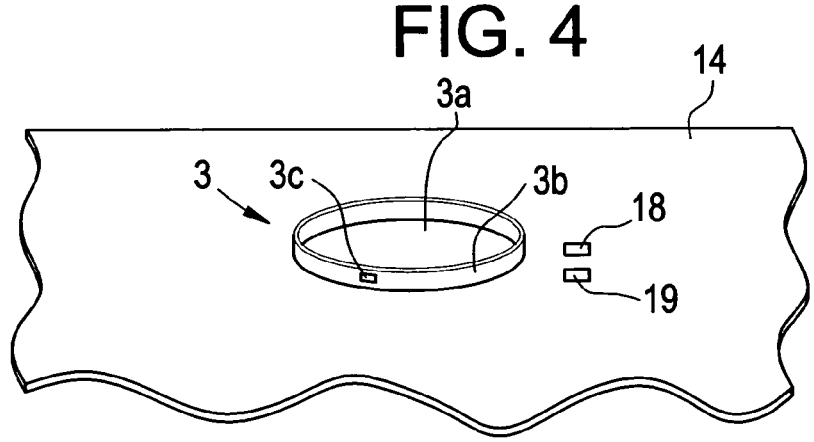
FIG. 4—A perspective view showing a state in which the bracket of FIGS. 1 through 3 is fixed by solder reflow to the surface of the circuit board.
Figure 5:
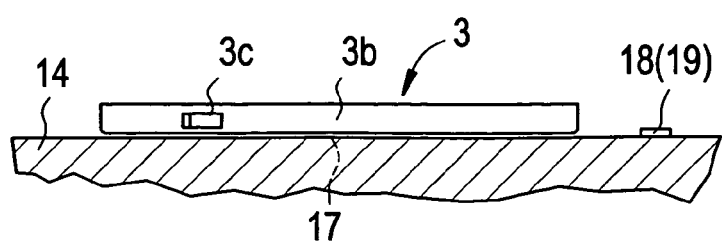
FIG. 5—A side view of FIG. 4.
Figure 6:
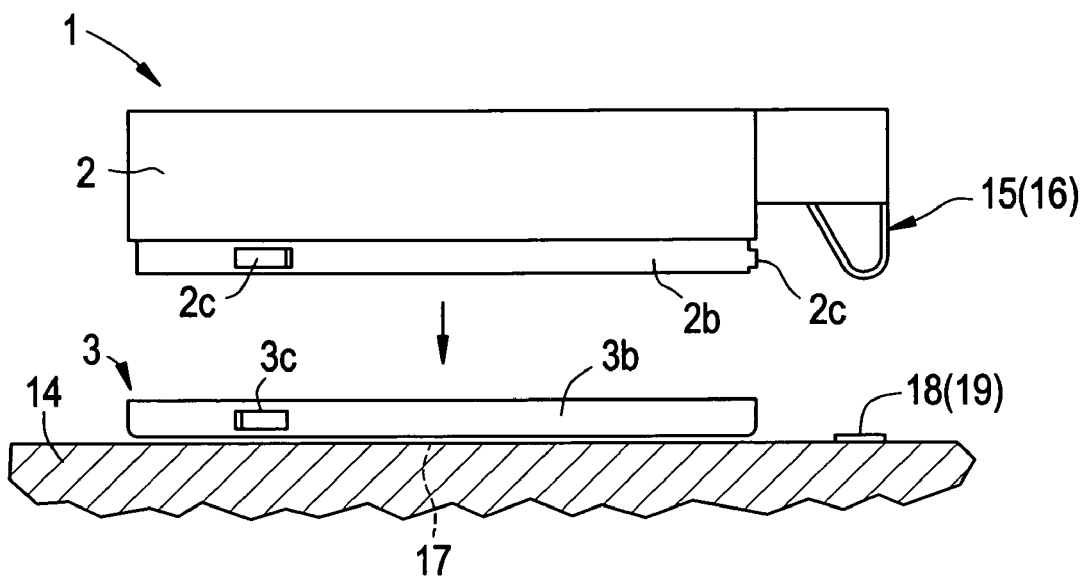
FIG. 6—A side view showing the multifunctional vibrating actuator before it is placed in the bracket fixed to the circuit board.
Figure 7:
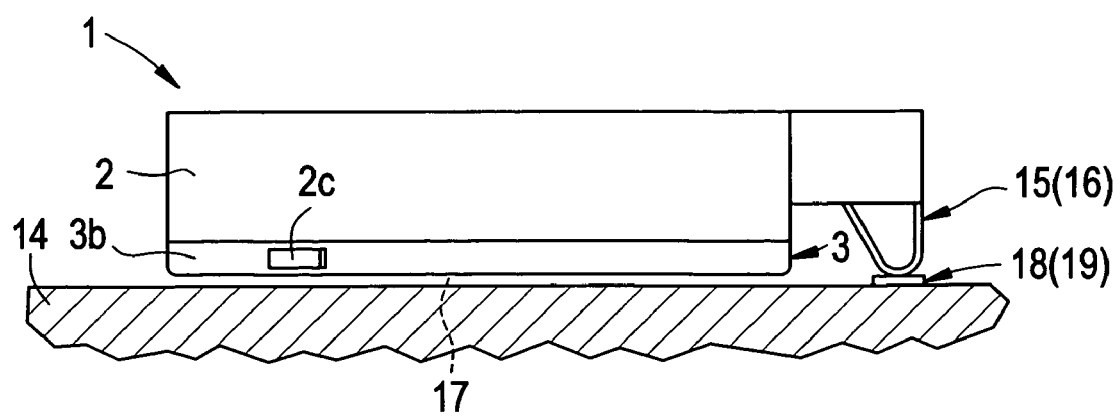
FIG. 7—A side view showing the multifunctional vibrating actuator after it is placed in the bracket fixed to the circuit board.

The first embodiment of the structure for mounting a multifunctional vibrating actuator on a circuit board (referred to below, as necessary, simply as the structure for mounting on a circuit board) of the present invention is explained below with reference to FIGS. 1 through 6. FIG. 1 is a perspective view showing an external view of the multifunctional vibrating actuator involved in the structure for mounting on a circuit board of the first embodiment. FIG. 2 is a side cross sectional view showing an internal structure of the multifunctional vibrating actuator, taken along broken line A-A of FIG. 1. FIG. 3 is a perspective view showing a bracket that is a part of the multifunctional vibrating actuator. FIG. 4 is a perspective view showing a state in which the bracket of FIGS. 1 through 3 is fixed by solder reflow to the surface of the circuit board. FIG. 5 is a side view of FIG. 4. FIGS. 6 and 7 are side views showing the multifunctional vibrating actuator being placed in the bracket fixed to the circuit board. Now, the components within the structure of the multifunctional vibrating actuator that have the same functions as those in the conventional example described above also have the same labels in the drawings, and duplicative explanations are omitted or simplified.

As shown in FIG. 2, the multifunctional vibrating actuator 1 that is mounted by the structure for mounting on a circuit board of the present invention has, within a housing 2, a magnetic circuit 5 that produces a bodily sensible vibration and a diaphragm 4 that produces sounds. The housing 2 is cylindrical and is open at both ends; in the upper opening is a step 2a. The diaphragm 4, which is attached to a voice coil 12 that is the driving means that produces the magnetic impulse that operates between it and the magnetic circuit 5, is fixed to this step 2a and supported by the housing 2. The voice coil 12 that is fixed to the central portion of the diaphragm 4 is inserted in the magnetic gap G of the magnetic circuit 5 when the diaphragm 4 is fixed to the step 2a, and a portion of it [the voice coil 12] is drawn outside the housing 2. A terminal seat 9 is formed as a part of the housing 2 and extends out in a radial direction from the outer periphery of the housing 2; a pair of terminals 15, 16 is attached to the terminal seat 9. Moreover, the portion of the voice coil that is drawn outside the housing 2 is connected to the terminals 15, 16 by a means of fixing such as soldering. In this way, the terminals and the voice coil are electrically connected.

The magnetic circuit 5 comprises a magnet 6 that is magnetized in the up and down direction of FIG. 2, a pole piece 7, and a yoke 8, so as to form a magnetic path through the magnetic gap G; it is flexibly supported with respect to the housing 2 by a suspension 1. The yoke 8 is formed in a dish shape with an interior depression, the magnet 6 being accommodated within the depression with the end face 6a of the magnet being fixed to the bottom surface 8a of the yoke 8. The disk-shaped pole piece 7 is fixed to the other end face 6b of the magnet 6. The yoke 8, the magnet 6, and the pole piece 7 are all circular when viewed from the top (the direction of arrow a), and all three parts are assembled on the same center and fixed. The magnet 6 is a rare earth magnet that has been powdered, sintered and solidified, then magnetized.

The open end of the housing opposite the open end to which the diaphragm 4 is fixed is slightly smaller in its outside diameter, and a tab 2c is formed on the slightly smaller outer wall 2b. The bracket 3 is fitted and fixed to this smaller open end. The bracket 3 and the housing 2 make up the casing of the multifunctional vibrating actuator 1. As shown in FIGS. 2 and 3, the bracket 3 is dish-shaped, with a flat bottom 3a and a rim 3b that rises vertically from the edge of the bottom 3a. The rim 3b has a cut-out 3c to fit with the tab 2c on the housing 2. The cut-out 3c is formed in the same shape as the tab 2c, and its size is slightly larger than that of the tab 2c.

Next, the structure for mounting on a circuit board is explained with reference to FIGS. 3 through 7. First, before it is fitted to the open end of the housing 2, the bracket 3 that is a part of the casing of the multifunctional vibrating actuator 1 is fixed by solder reflow to the surface of the circuit board 14. A cream solder 17 is applied by patterning printing on the surface of the circuit board 14 that is to be placed inside the portable terminal equipment case. The bracket 3 is set in place on the surface of the circuit board 14 with the face of the bracket bottom 3a in contact with a portion of the applied solder 17.

With the bracket 3 in place, the circuit board 14 is inserted into a reflow tank (not illustrated). The solder 17 is melted by heating in the reflow tank. After heating, the circuit board 14 is removed from the reflow tank, and the melted solder solidifies as the heat dissipates. In this way, the bracket positioned on the circuit board 14 is fixed to the circuit board 14 by solder reflow.

The bracket 3 can be made of stainless steel, a polymer, or other material. If the bracket 3 is made of a material with no adhesion to the solder 17, just the face that contacts the solder 17 can be made of metal.

After the heat has dissipated from the circuit board 14 and the bracket 3, the multifunctional vibrating actuator 1 with all parts assembled other than the bracket 3 is fitted and fixed in place in the bracket 3, as shown in FIGS. 6 and 7. The fitting, as described above, is done by fitting the tab 2c of the housing 2 and the cut-out 3c of the bracket 3. The bracket 3 will have been fixed to the surface of the circuit board with a position relative to the electrodes 18, 19 that are formed on the circuit board 14 such that, when the housing 2 is fitted to the bracket 3, the terminals 15, 16 will contact and be electrically connected to the electrodes 18, 19.

In this way, using the structure for mounting on a circuit board of this embodiment makes it possible for a multifunctional vibrating actuator to be mounted on the surface of a circuit board by solder reflow without exposing the components of the multifunctional vibrating actuator that have poor heat resistance to the high temperatures that accompany heating in a reflow tank during solder reflow fixing (the voice coil, the diaphragm, and the magnet) to the high temperatures of the reflow tank.

Second Embodiment

Figure 8:
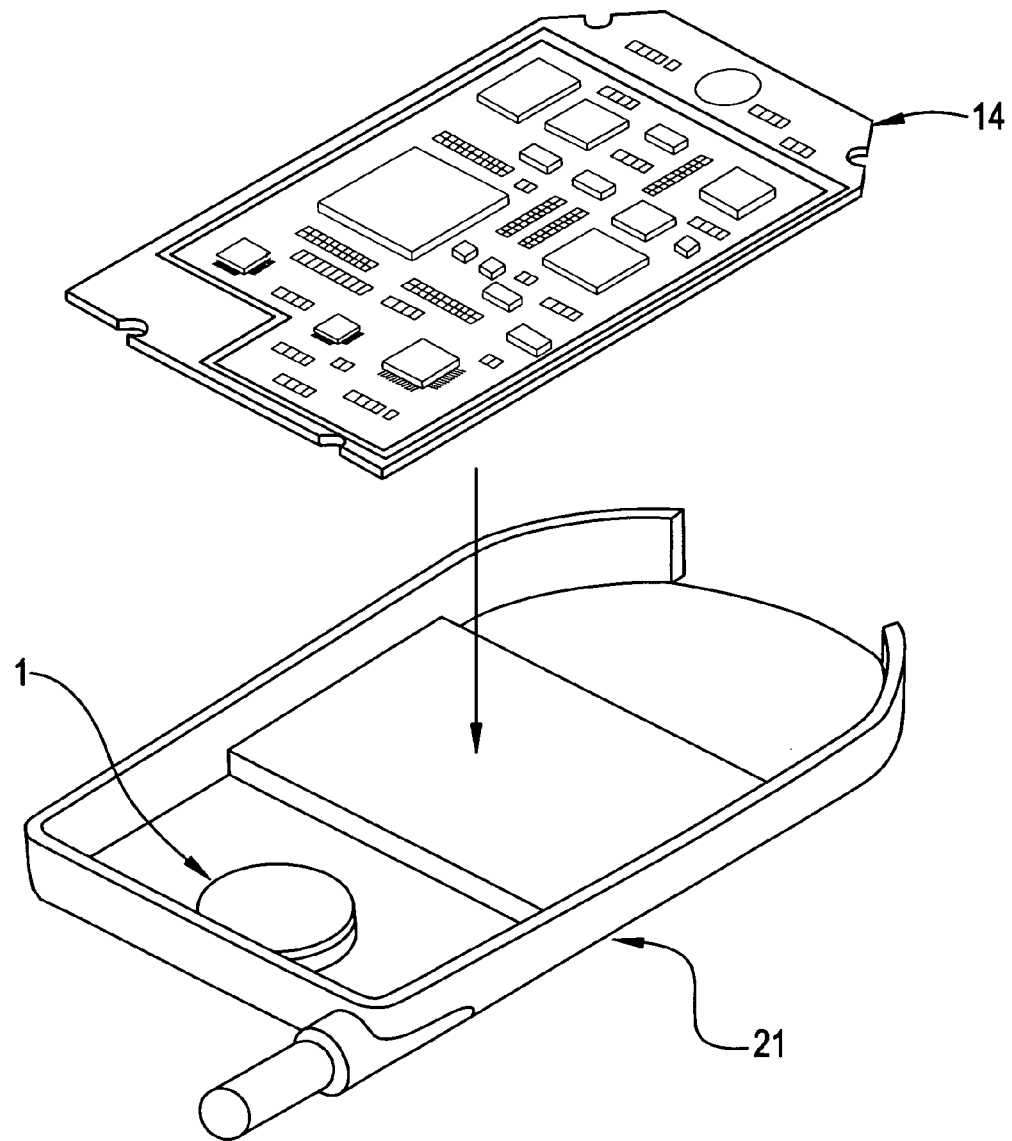
FIG. 8—A schematic perspective view showing the relative positions of the multifunctional vibrating actuator and the circuit board within the portable terminal equipment.
Figure 9:
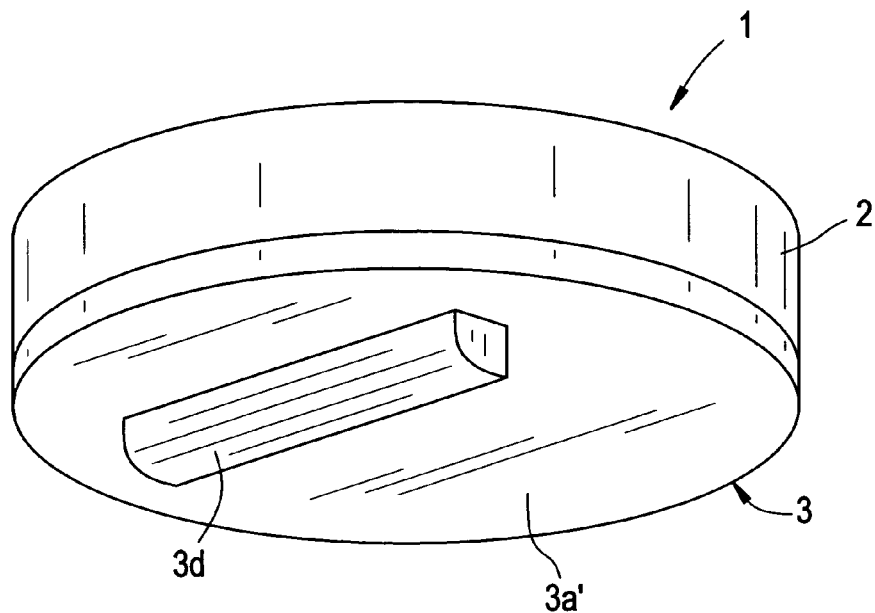
FIG. 9—A perspective view showing the multifunctional vibrating actuator of the second embodiment.
Figure 10:
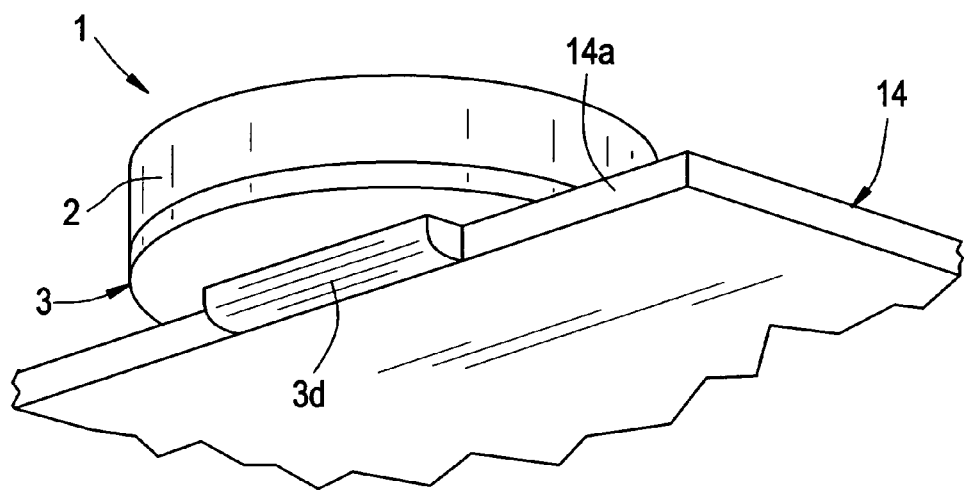
FIG. 10—A perspective view showing the multifunctional vibrating actuator of FIG. 9 mounted on the circuit board.
Figure 11:
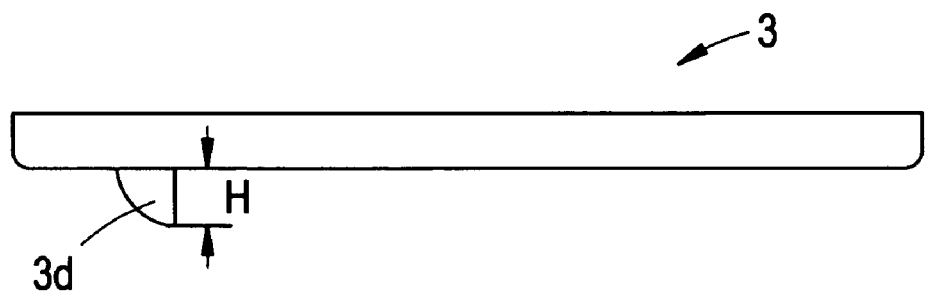
FIG. 11—A side view of the bracket.

Next, the second embodiment of the present invention for a structure for mounting on a circuit board is explained below with reference to FIGS. 8 through 10. Now, the components that have the same functions as those in the first embodiment described above also have the same labels in the drawings, and duplicative explanations are omitted or simplified. FIG. 8 is a schematic perspective view showing the relative positions of the multifunctional vibrating actuator and the circuit board within the portable terminal equipment. FIG. 9 is a perspective view showing the multifunctional vibrating actuator of the second embodiment. FIG. 10 is a perspective view showing the multifunctional vibrating actuator of FIG. 9 mounted on the circuit board, and FIG. 11 is a side view of the bracket. FIG. 8 is an oblique conceptual view showing the relative positions of the multifunctional vibrating actuator and the circuit board within the portable terminal equipment. FIG. 9 is a perspective view showing an external view of the multifunctional vibrating actuator of the second embodiment. FIG. 10 is a perspective view showing the multifunctional vibrating actuator of FIG. 9 mounted on the circuit board, and FIG. 11 is a side view of the bracket.

The point on which the second embodiment differs from the first embodiment is that a projection 3$d$ is formed as a unit with the bottom surface 3$a$' of the bracket 3 that is in contact with the circuit board 14. As shown in FIG. 8, the multifunctional vibrating actuator 1 acts as the speaker that conveys to the user the sound received from the other end of the communication, and so when placed in the portable terminal equipment 21 it is located at a point corresponding to the user's ear. In most cases, therefore, it is located inside one end of the case of the portable terminal equipment 21.

For mounting at the end of the case of the portable terminal equipment 21, the position of the multifunctional vibrating actuator 1 should also be placed toward one end of the circuit board 14. Therefore, in consideration of mounting at the end of the circuit board 14, a projection 3$d$ is formed on the bottom surface 3$a$' of the bracket 3 that is in contact with the circuit board 14, and with the projection 3$d$ held in place at the end 14$a$ of the circuit board 14, the bracket 3 is fixed to the surface of the circuit board 14 as explained in the first embodiment; after the bracket 3 is fixed, the multifunctional vibrating actuator 1 is placed in the bracket 3.

The projection 3$d$ can be formed by cutting the bottom face 3$a$ and making it project, or by forming it as a part separate from the bracket 3 and bonding it to the bottom face 3$a$'. The height H of the projection 3$d$ is preferably the same as the height of the end of the circuit board 14, or in other words, the thickness of the circuit board 14.

By means of the structure described above, even if surface tension is produced between the bottom face 3$a$' of the bracket 3 and the surface of the circuit board 14 when the solder melts, the projection 3$d$ will be maintained in place at the end 3$d$ of the circuit board 14, and so the bracket 3 will be prevented from floating up from the surface of the circuit board 14. Thus the bracket 3 can be fixed to the surface of the circuit board 14 by solder reflow fixing with the bracket 3 accurately positioned on the circuit board 14.

The bracket 3 is fixed by solder reflow with accurate positioning, and so the multifunctional vibrating actuator 1 that is ultimately fitted and fixed in the bracket can be mounted on the circuit board 14 with accuracy and precision.

Third Embodiment

Figure 12:
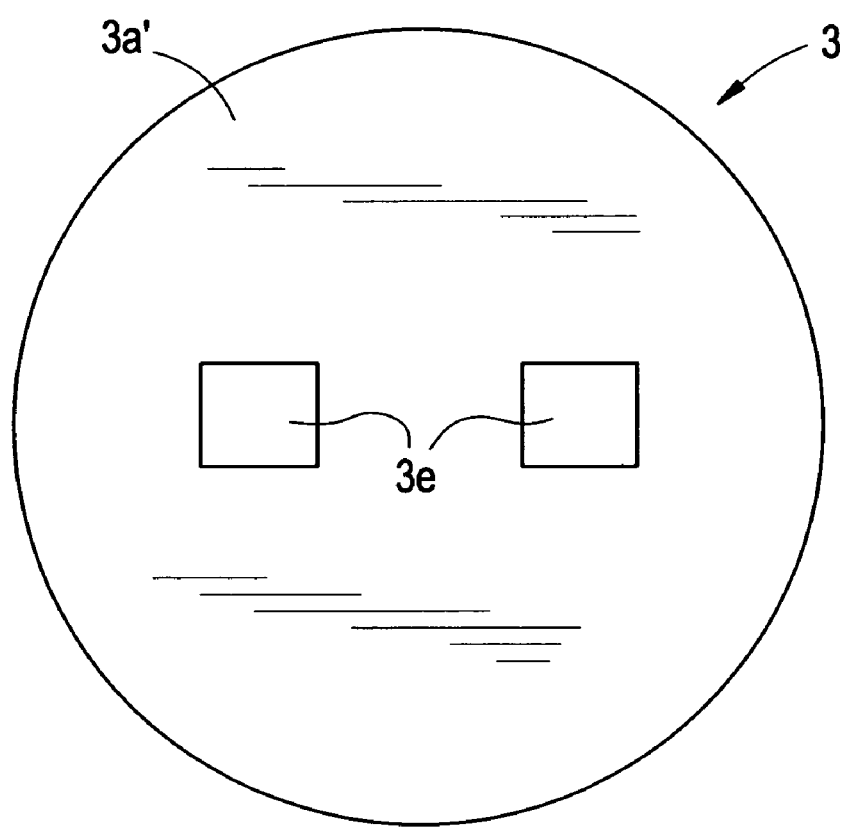
FIG. 12—A bottom plan view of the bracket of the structure for mounting on a circuit board of the third embodiment.
Figure 13:
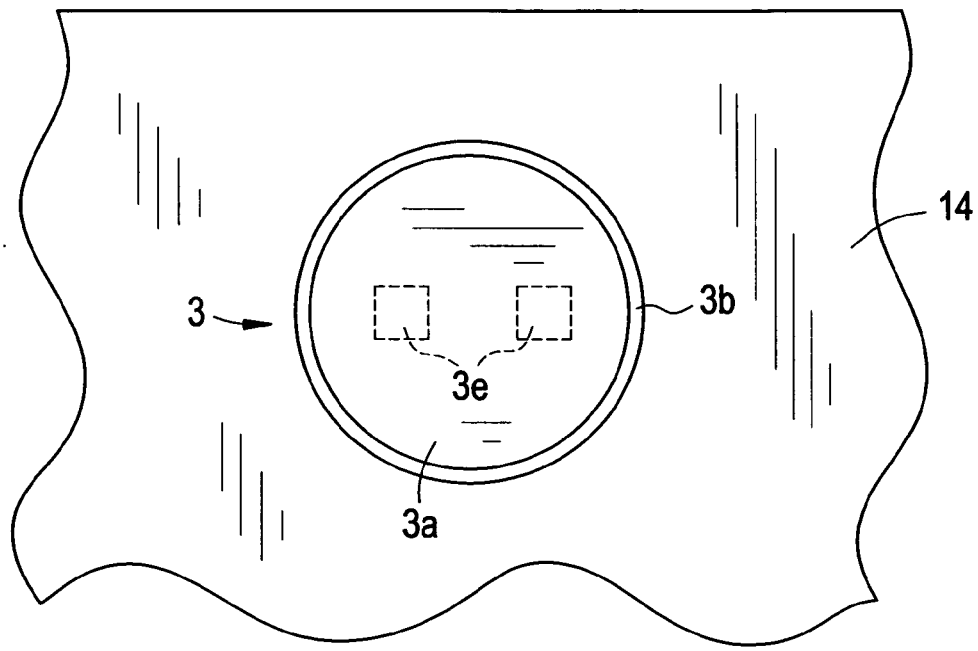
FIG. 13—A plan view showing the bracket of FIG. 12 when fixed by solder reflow to the circuit board.

Next, the third embodiment of the present invention for a structure for mounting on a circuit board is explained with reference to FIGS. 12 and 13. FIG. 12 is a bottom plan view of the bracket of the structure for mounting on a circuit board of the third embodiment, and FIG. 13 is a plan view showing the bracket of FIG. 12 when fixed by solder reflow to the circuit board. Now, the components that have the same functions as those in the embodiments described above also have the same labels in the drawings, and duplicative explanations are omitted or simplified.

The point on which the third embodiment differs from the embodiments described above is that there are provided at least two convex contact points on the bottom face 3$a$' of the bracket 3; these contact the solder applied to the surface of the circuit board 14 and are fixed by solder reflow.

As described above, when the solder melts during the solder reflow fixing of the bracket 3, surface tension is produced in the molten solder between the bottom face 3$a$' of the bracket 3 and the surface of the circuit board 14, and the bracket 3 floats up. Using this embodiment, however, convex contacts 3$e$ are placed on the bottom face 3$a$', by which means contact with molten solder across the full bottom face 3$a$' is prevented. Therefore, only the contacts 3$e$ touch the molten solder, and the portion affected by surface tension can be limited to the contacts 3$e$. By limiting the portion affected by surface tension to a few contacts, it becomes possible to achieve a self-alignment effect in which the bracket 3 is moved to the designated position on the surface of the circuit board and the bracket 3 is accurately positioned on the circuit board.

In this way, using this embodiment limits the portion affected by surface tension to a few contacts and makes it possible to accurately position the bracket on the surface of the circuit board by means of the self-alignment effect.

Figure 14:
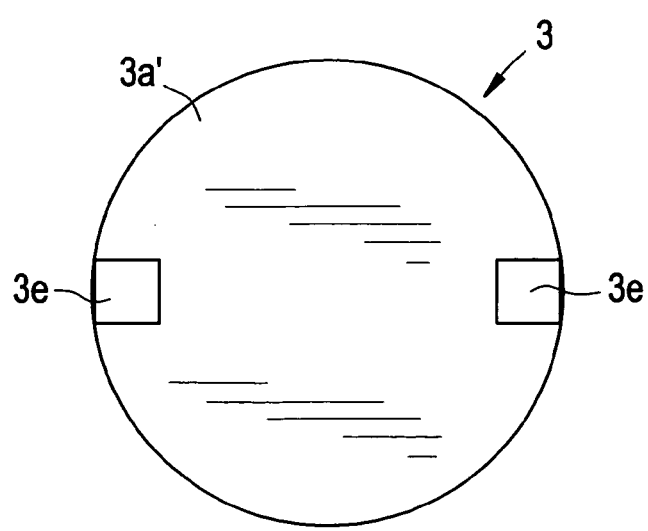
FIG. 14—A bottom plan view of a modification of the bracket of FIG. 12.

In order to assure the self-alignment effect, moreover, it is effective to increase as much as possible the space between the few contacts that are affected by surface tension. Therefore, it is most suitable to place the contacts 3$e$ on the edge of the bottom face 3$a$' of the bracket 3, as shown in FIG. 14, and to locate the contacts 3$e$ on opposite edges with symmetry around the center point of the bottom face 3$a$'. By locating the contacts 3$e$ in this way, it is possible to maximize the space between the contact points 3$e$ and achieve a more accurate self-alignment effect.

Fourth Embodiment

Figure 15:
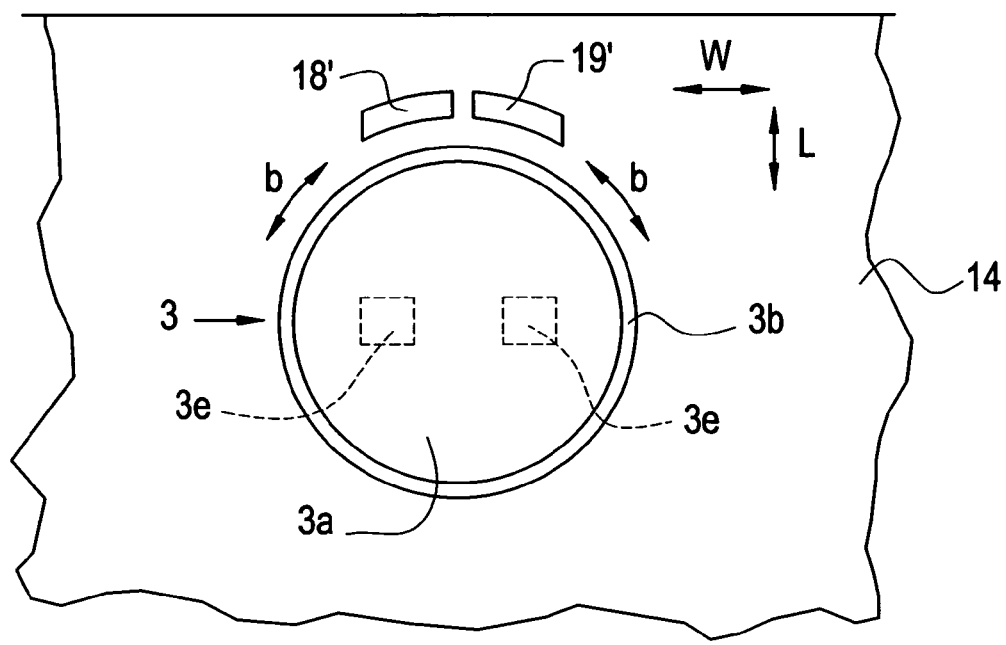
FIG. 15 A plan view showing the tops of the electrodes of the fourth embodiment of the structure for mounting on a circuit board.
Figure 16:
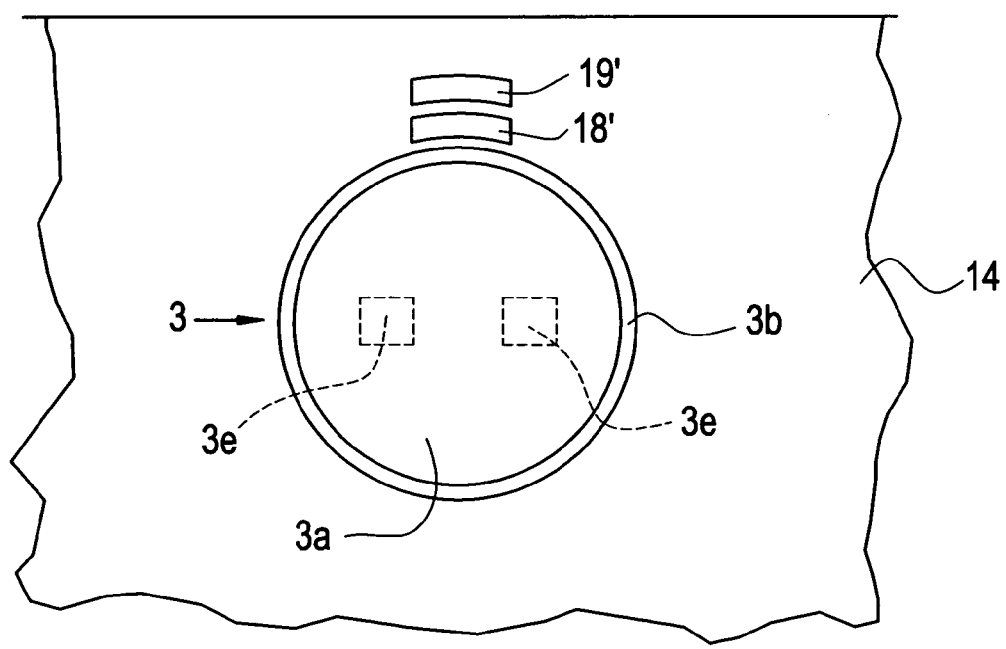
FIG. 16—A plan view of a modification of the electrodes in FIG. 15.

Next, the fourth embodiment of the present invention for a structure for mounting on a circuit board is explained with reference to FIGS. 15 and 16. FIG. 15 is a plan view showing the tops of the electrodes of the fourth embodiment of the structure for mounting on a circuit board, and FIG. 16 is a plan view showing a modification of the electrodes in FIG. 15. Now, the components that have the same functions as those in the embodiments described above also have the same labels in the drawings, and duplicative explanations are omitted or simplified.

The point on which the fourth embodiment differs from the embodiments described above is that the shape, when seen from above (hereafter a "plan view," as necessary), of the electrodes 19', 19' that are set on the surface of the circuit board is one with measurements that are different, as shown in FIG. 15, in the length direction (the direction of the arrow L in the figure) and the width direction (the direction of the arrow W in the figure).

Moreover, the two electrodes 18', 19', positive and negative, are formed to have the same position in the length direction in a plan view [i.e., the same distance from the edge of the circuit board]; they are insulated by the space between the electrodes.

Because multiple contacts 3$e$ are formed on the bottom face of the bracket 3, as described above, the bracket 3 is floated in the direction of arrow b by the self-alignment effect when it is fixed to the surface of the circuit board 14 by solder reflow. Consequently, the electrodes are formed in a roughly rectangular shape with different measurements in the length and width directions, and run along the direction in which the bracket 3 floats. Since the float direction of the bracket 3 is a rough arc, as shown by the direction of arrow b in the figure, the electrodes 18', 19' are rectangular and generally arc-shaped.

Forming the electrodes 18', 19' in this way makes it possible to give the electrodes 18', 19' a degree of width in their measurement in the direction of the width. Accordingly, when the multifunctional vibrating actuator 1 is fitted and fixed to the bracket 3, even if floating by the bracket 3 moves the general location of the multifunctional vibrating actuator 1 away from its designated position and the contact points of the terminals 15, 16 are not in their designated positions, the wider measurements of the electrodes 18', 19' in the direction of width will make up for that positioning error. Therefore, even if the bracket 3 is floated by the solder reflow fixing, contact between the contact points of the terminals 15, 16 and the electrodes 18', 19' is always assured, and so it is possible to have a certain electrical connection between the multifunctional vibrating actuator 1 and the circuit board 14.

Therefore, the plan view shape of the electrodes 18', 19' of this embodiment is optimum for a structure for fixing the multifunctional vibrating actuator by solder reflow.

Now, this embodiment can be modified in various ways on the basis of technical considerations. For example, if the positions of the terminal contact points of the multifunctional vibrating actuator are laid out in the length direction, then as shown in FIG. 16, the positive and negative electrodes 18', 19' can be formed in different positions in the length direction. Forming them in this way can make the insulation between the electrodes 18', 19' more certain.

Fifth Embodiment

Figure 17:
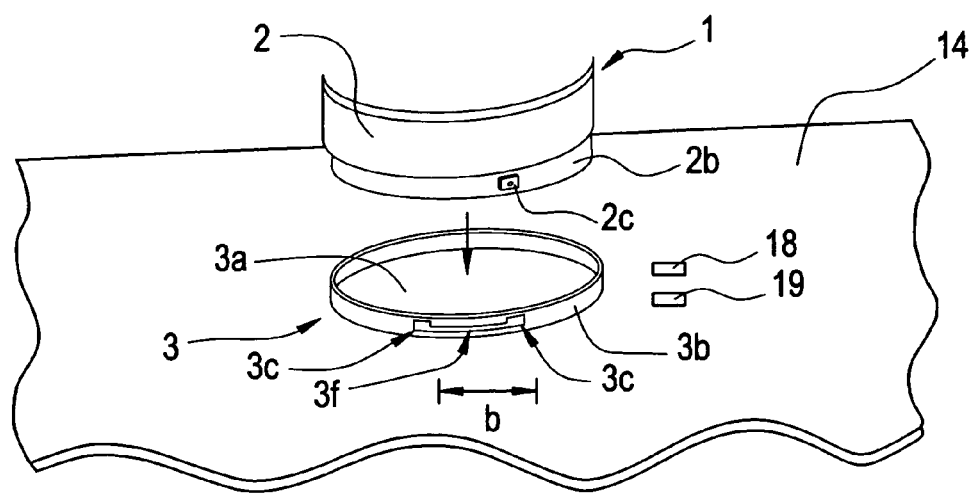
FIG. 17—A perspective view of the bracket and a portion of the housing of the multifunctional vibrating actuator to be fitted and fixed in the bracket of the fifth embodiment.

Next, the fifth embodiment of the present invention for a structure for mounting on a circuit board is explained with reference to FIG. 17. FIG. 17 is a perspective view showing the bracket of the fifth embodiment and a portion of the housing of the multifunctional vibrating actuator to be fitted and fixed in the bracket. Now, the components that have the same functions as those in the embodiments described above also have the same labels in the drawings, and duplicative explanations are omitted or simplified.

The point on which the fifth embodiment differs from the embodiments described above is that the rim 3b of the bracket 3 has multiple cut-outs 3c, 3c to fit with a single tab 2c. The cut-outs 3c, 3c are formed as a unit by a cut 3f that has a height lower than that of the cut-outs 3c, 3c.

As explained in regard to the first embodiment, the opening at one end of the housing 2 of the multifunctional vibrating actuator 1 and the bracket 3, which is fixed by solder reflow to the surface of the circuit board 14, are firmly fixed together by fitting the tab 2c into a cut-out 3c. However, because the self-alignment effect causes the bracket 3 to float in the direction of the arrow b of FIG. 17 during solder reflow, the position of the cut-out 3c relative to the surface of the circuit board 14 cannot be determined uniformly. Accordingly, the positions of the contact points of the terminals 15, 16 (not illustrated in FIG. 17) of the multifunctional vibrating actuator 1 that is fitted and fixed to the bracket 3 similarly cannot be determined uniformly. There is, therefore, a risk that the electrodes 18, 19 and the contact points of the terminals 15, 16 will not line up when the multifunctional vibrating actuator 1 is fitted and fixed to the bracket 3.

This embodiment, however, has multiple cut-outs 3c, 3c spaced at an interval that corresponds to the amount of bracket 3 float (the measurement of arrow b) caused by the self-alignment effect, and so the float will always position one of the cut-outs 3c, 3c in a given location relative to the surface of the circuit board 14. Accordingly, it will be possible to fit and fix the multifunctional vibrating actuator 1 to the bracket 3 in a given position relative to the surface of the circuit board 14. Therefore, even though the bracket 3 is floated by solder reflow fixing, it is always possible to assure contact between the contact points of the terminals 15, 16 and the electrodes 18', 19', so that the electrical connection between the multifunctional vibrating actuator 1 and the circuit board 14 will be certain.

Moreover, the multiple cut-outs 3c, 3c can be formed as a single unit by means of a cut 3f, such that the multiple cut-outs 3c are placed in the rim 3b in a single manufacturing process, thus simplifying the manufacturing process.

Sixth Embodiment

Figure 18:
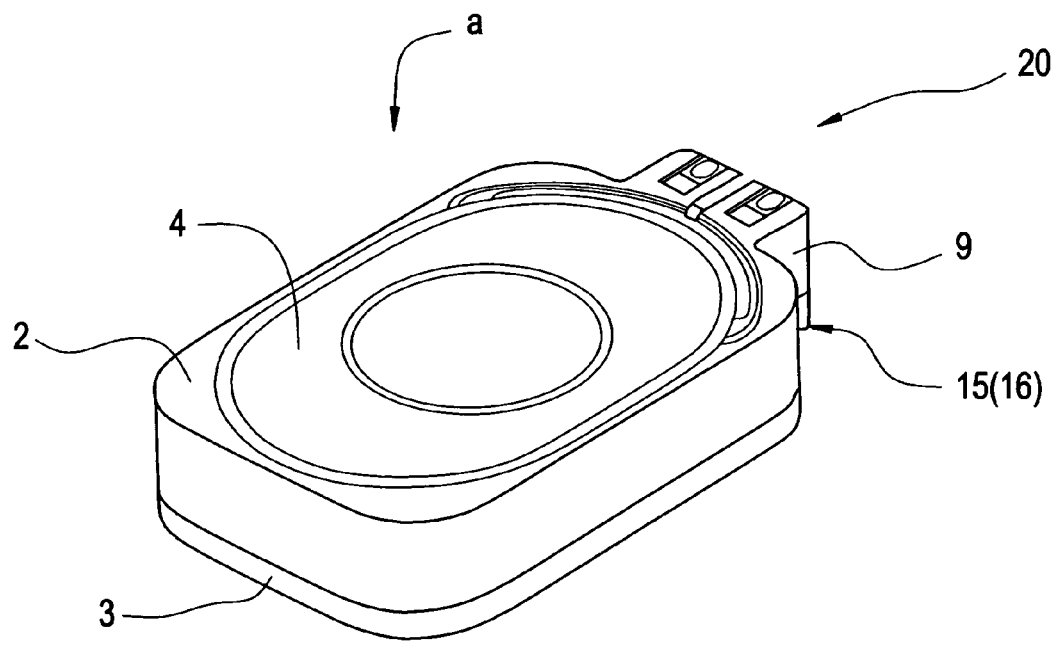
FIG. 18—A schematic perspective view showing the multifunctional vibrating actuator of the structure for mounting on a circuit board of the sixth embodiment.
Figure 19:
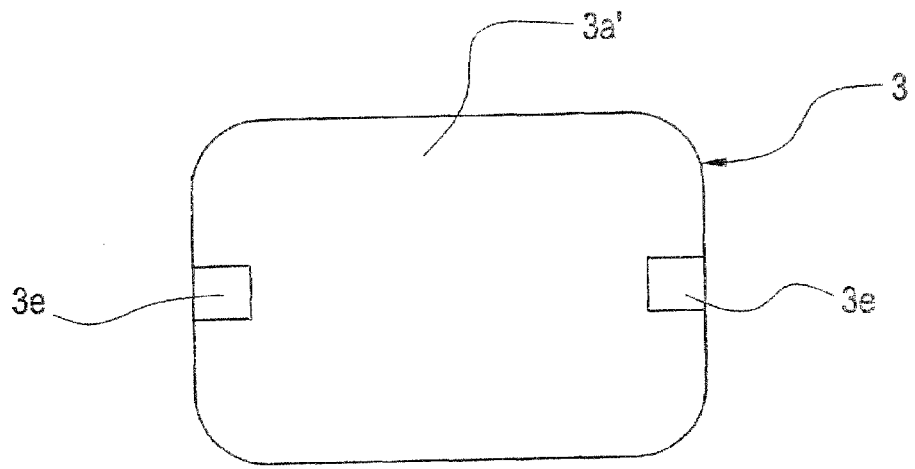
FIG. 19—A plan view, from the bottom surface that faces the circuit board, of the bracket in which the multifunctional vibrating actuator of FIG. 18 is to be fitted and fixed.
Figure 20:
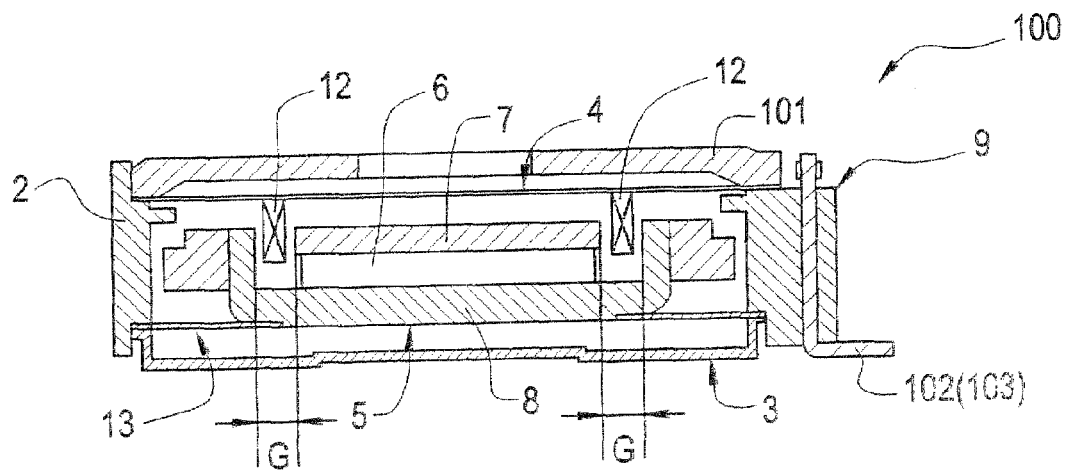
FIG. 20—A side sectional view showing the structure of a conventional multifunctional vibrating actuator.
Figure 21:
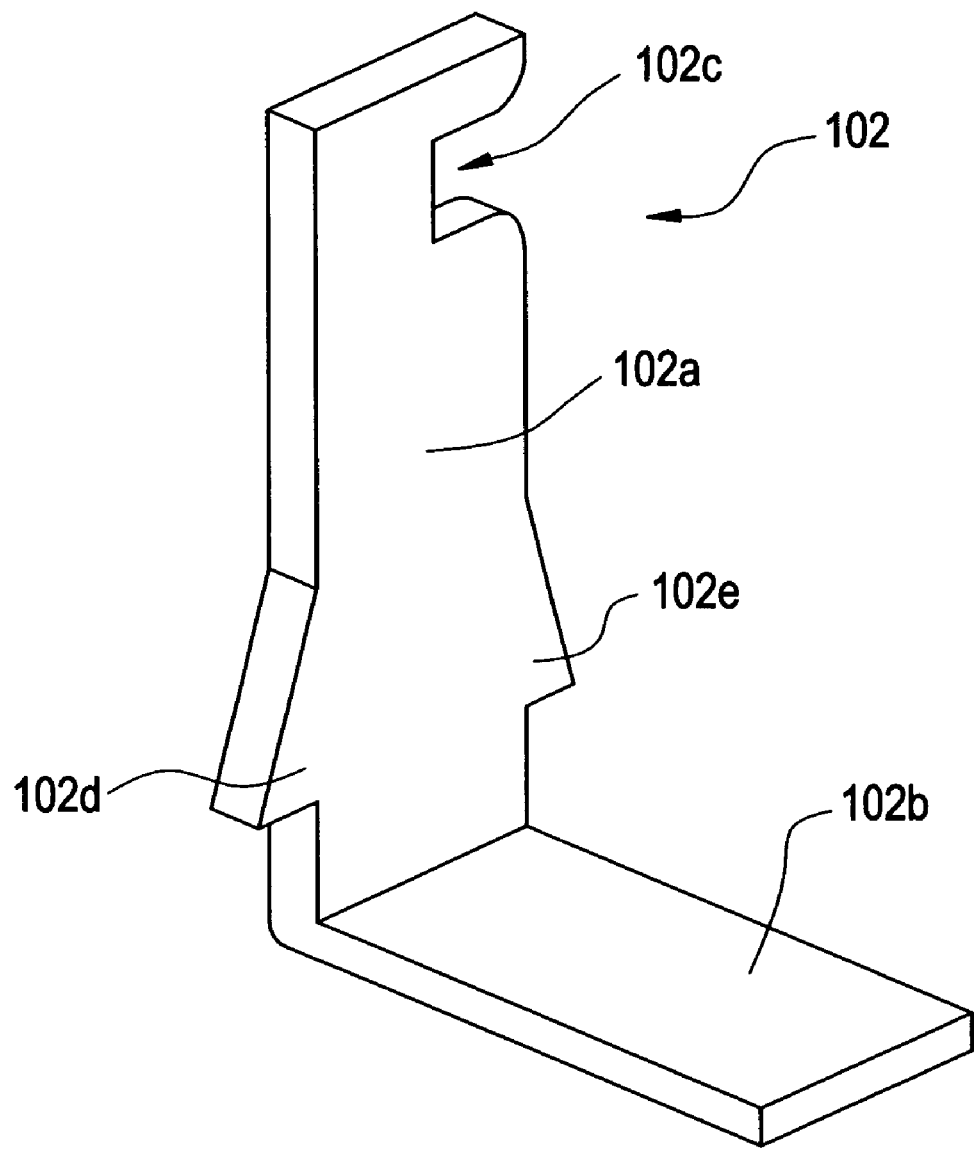
FIG. 21—An enlarged perspective view of one terminal of the multifunctional vibrating actuator of FIG. 20.
Figure 22:
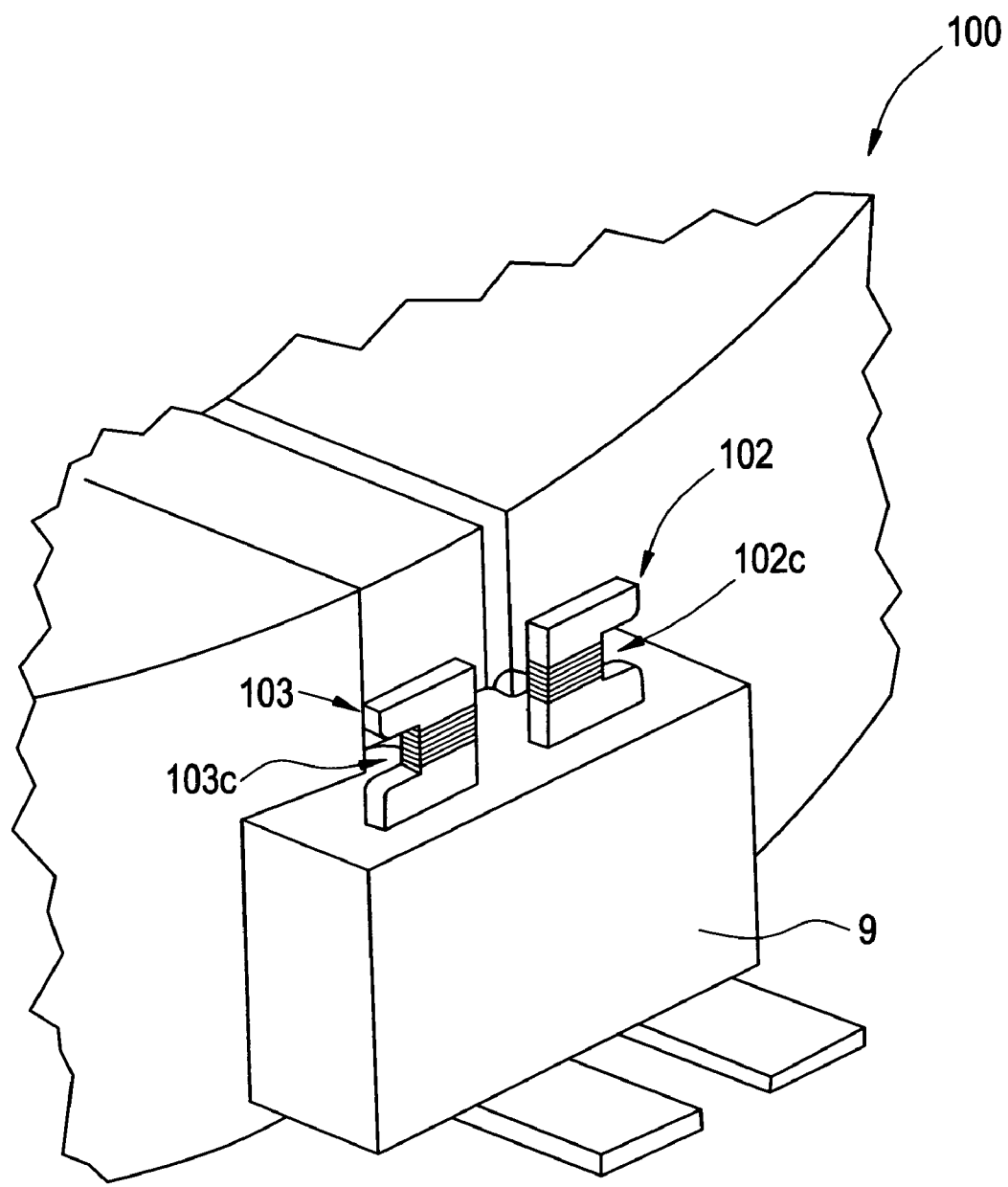
FIG. 22—A perspective view of a portion of the coil when connected to the terminal of FIG. 21.
Figure 23:
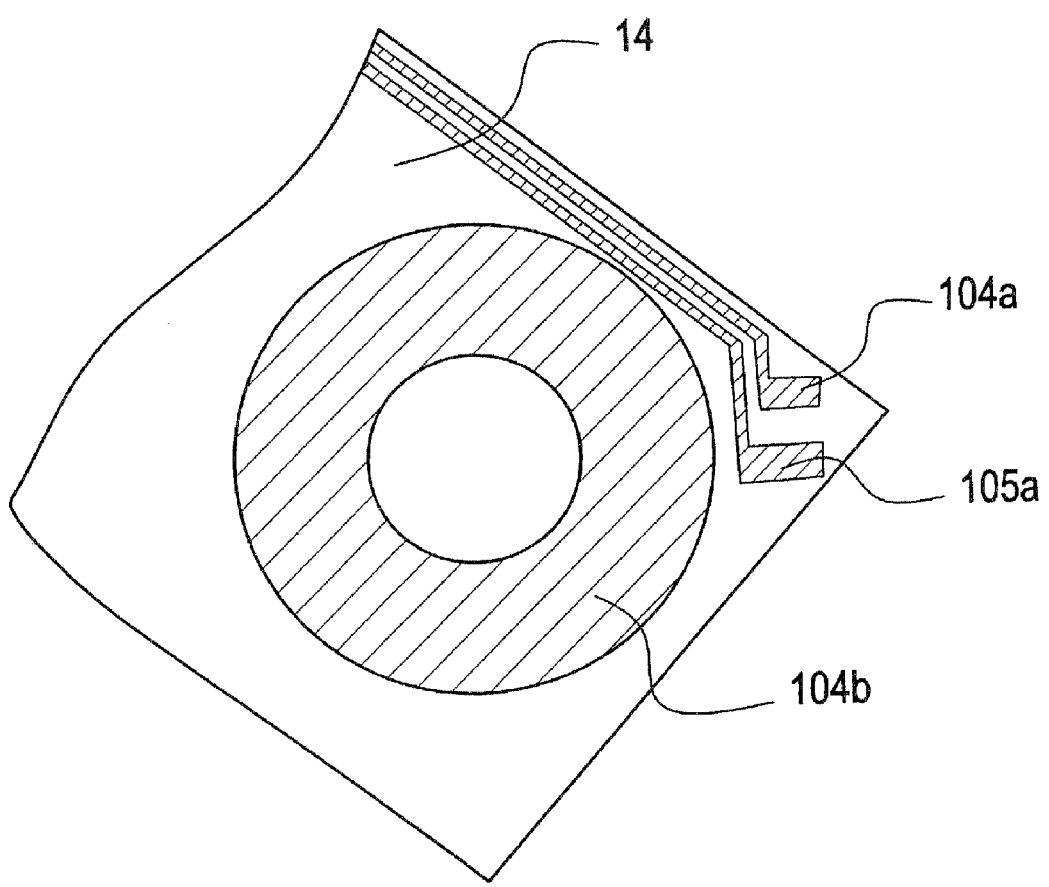
FIG. 23—A plan view of the circuit board for fixing the multifunctional vibrating actuator of FIG. 20 by solder reflow.
Figure 24:
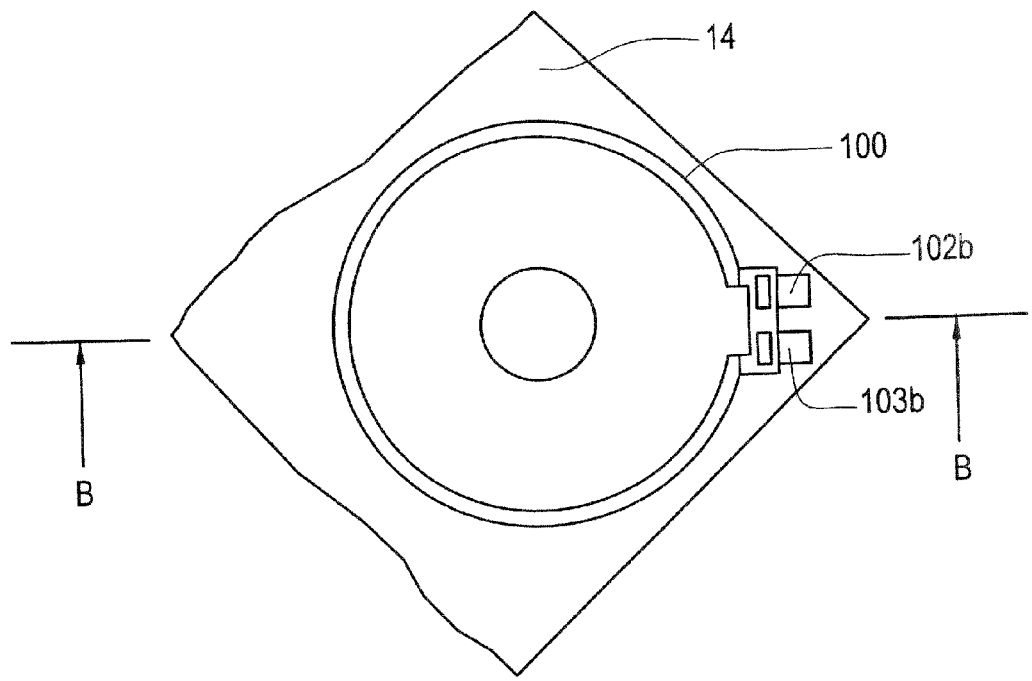
FIG. 24—A plan view showing a state in which the multifunctional vibrating actuator is fixed to the surface of the circuit board of FIG. 23.
Figure 25:
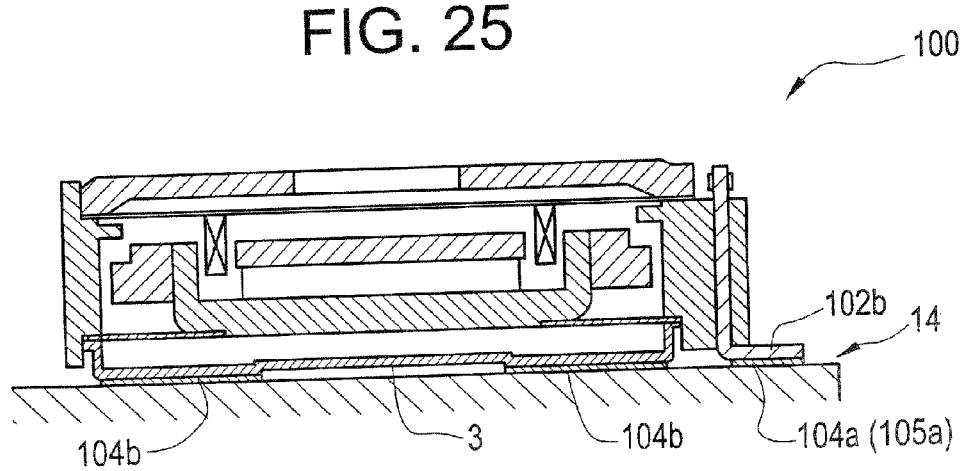
FIG. 25—A side sectional view, taken along a dash-dotted line B-B of FIG. 24.

Next, the sixth embodiment of the present invention for a structure for mounting on a circuit board is explained with reference to FIGS. 18 and 19. FIG. 18 is a schematic perspective view showing the multifunctional vibrating actuator involved in the sixth embodiment of the structure for mounting on a circuit board. FIG. 19 is a plan view, from the bottom surface that faces the circuit board, of the bracket in which the multifunctional vibrating actuator of FIG. 18 is to be fitted and fixed. Now, the components that have the same functions as those in the embodiments described above also have the same labels in the drawings, and duplicative explanations are omitted or simplified.

The point on which the sixth embodiment differs from the embodiments described above is that the shape of the multifunctional vibrating actuator 20 as seen in plan view (in the direction of arrow a) has an unequal ratio of length to width, and the shape of the bracket 3 in which the housing 2 is fitted also has an unequal ratio of length to width in order to accommodate the multifunctional vibrating actuator 20. Hereafter, the shape as seen in plan view (in the direction of arrow a) is referred to, as necessary, as the plan view shape.

The plan view shape of the multifunctional vibrating actuator 20 and the bracket 3 is roughly rectangular, and the bottom face 3a' of the bracket 3 that contacts the circuit board 14 (not illustrated) has multiple contact points 3e, 3e located at the edges of the bracket 3 on its long axis.

By means of this structure, it is possible to have a greater space, relative to other embodiments, between the contact points 3e, 3e, so that a more definite self-alignment effect can be achieved. The bracket 3 can be fixed by solder reflow to the surface of the circuit board with even greater accuracy of positioning on the surface of the circuit board. Accordingly, the accuracy with which the multifunctional vibrating actuator 20, which is fitted and fixed in the bracket 3, can be attached to the surface of the circuit board is even greater than in other embodiments.

DESCRIPTION OF REFERENCE NUMERALS 1, 20 Multifunctional vibrating actuator
2 Housing
3 Bracket
4 Diaphragm
5 Magnetic circuit
6 Magnet
7 Pole piece
8 Yoke
9 Terminal seat
12 Voice coil
13 Suspension
14 Circuit board
15, 16 Terminals
17 Solder
18, 19, 18', 19' Electrodes
21 Portable terminal equipment

The invention claimed is:

1. A structure for mounting a multifunctional vibrating actuator on a circuit board, the multifunctional vibrating actuator having a diaphragm, a magnetic circuit that is positioned facing the diaphragm and that forms a magnetic path, a suspension that supports the magnetic circuit, a housing that supports the diaphragm and the suspension, and a voice coil that produces magnetic drive that operates between the diaphragm and the magnetic circuit, and having terminals that are attached to the housing and that are electrically connected to the voice coil, the structure for mounting comprises:

a bracket fixed to the surface of the circuit board by solder reflow, the bracket including a cut-out portion, wherein the housing of the multifunctional vibrating actuator includes a tab to be engaged with the cut-out portion of the bracket and is detachable from the bracket to allow the bracket to be fixed on the surface of the circuit board without the multifunctional vibrating actuator, wherein the housing of the multifunctional vibrating actuator is mounted on the surface of the circuit board using the bracket, wherein the bracket is fixed on the surface of the circuit board with the terminals attached to the housing electrically connected to the circuit board prior to the multifunctional vibrating actuator being mounted to the bracket.

2. A structure for mounting a multifunctional vibrating actuator on a circuit board, in which a mounting position of the multifunctional vibrating actuator relative to the circuit board is set on a surface near one end of the circuit board, and in which there is a projection on a surface of a bracket that faces the circuit board, the bracket being fixed by solder reflow to the surface of the circuit board while the bracket is being held in place on the surface of the circuit board by the projection, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator with the tab is detachable from the cut-out portion of bracket and is mountable on the circuit board using the bracket after the bracket is fixed to the circuit board by solder reflow to avoid exposing the multifunctional vibrating actuator to solder reflow.

3. A structure for mounting a multifunctional vibrating actuator on a circuit board, in which a surface of a bracket that faces the circuit board has two or more convex contacts that contact solder applied to the surface of the of the circuit board and are fixed by solder reflow, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator is detachable from the bracket and is mountable to the bracket, and wherein the bracket is fixed to the circuit board by solder reflow prior to the multifunctional vibrating actuator being mounted to the bracket to avoid exposing the multifunctional vibrating actuator to solder reflow.

4. A structure for mounting a multifunctional vibrating actuator on a circuit board, in which multiple bracket contacts are set at an edge of a bracket, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator is detachable from the bracket and is mountable on the circuit board using the bracket after the bracket is fixed to the circuit board.

5. A structure including a bracket for mounting a multifunctional vibrating actuator on a circuit board, in which flat electrodes formed on a surface of the circuit board are formed with different ratios of length measurement to width measurement, and a positive electrode and a negative electrode have positions that are the same in a length direction and that are the same distance from an edge of the circuitboard, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator is detachable from the bracket and is mountable on the circuit board using the bracket after the bracket is fixed to the circuit board.

6. A structure including a bracket for mounting a multifunctional vibrating actuator on a circuit board, in which flat electrodes formed on a surface of the circuit board are formed with different ratios of length measurement to width measurement, and a positive electrode and a negative electrode have positions that differ in a length direction, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator is detachable from the bracket and is mountable on the circuit board using the bracket after the bracket is fixed to the circuit board.

7. A structure for mounting a multifunctional vibrating actuator on a circuit board, in which a bracket is formed in a dish shape, with a bottom part and a rim that rises from the edge of the bottom part, an end of a housing of the multifunctional vibrating actuator being fitted to the rim to attach the bracket to the housing, there being a tab on the end of the housing that fits with the rim and multiple first cut-outs in the rim of the bracket that fit with the tab of the housing, the multiple first cut-outs being formed as a unit connected by a second cut-out lower than a height of the multiple first cut-outs, wherein the multifunctional vibrating actuator is detachable from the bracket and is mountable on the circuit board using the bracket after the bracket is fixed to the circuit board.

8. A structure for mounting a multifunctional vibrating actuator on a circuit board, in which a flat surface of a bracket is formed with an unequal length/width ratio, and there are on the flat surface of a bracket on a longer axis of a length/width ratio two or more convex contacts that contact the solder applied to the surface of the circuit board and that are fixed by solder reflow, the bracket including a cut-out portion, and the multifunctional vibrating actuator including a tab to be engaged with the cut-out portion of the bracket when the multifunctional vibrating actuator is mounted to the bracket, wherein the multifunctional vibrating actuator is detachable from the bracket and is mountable on the circuit board using the bracket after the bracket is fixed to the circuit board by solder reflow to avoid exposing the multifunctional vibrating actuator to solder reflow.

9. A portable terminal equipment in which the multifunctional vibrating actuator having the mounting structures described in any of claims 1 through 8 to mount the multifunctional vibrating actuator on the circuit board.

* * * * *